(12) United States Patent
Lee

(10) Patent No.: US 10,559,734 B2
(45) Date of Patent: Feb. 11, 2020

(54) LIGHT EMITTING DEVICE PACKAGE AND LIGHT UNIT INCLUDING THE SAME

(71) Applicant: LG INNOTEK CO., LTD., Seoul (KR)

(72) Inventor: Dong Yong Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/178,219

(22) Filed: Nov. 1, 2018

(65) Prior Publication Data

US 2019/0109267 A1    Apr. 11, 2019

Related U.S. Application Data

(60) Continuation of application No. 15/631,784, filed on Jun. 23, 2017, now Pat. No. 10,147,857, which is a (Continued)

(30) Foreign Application Priority Data

Jun. 29, 2011 (KR) .................. 10-2011-0064097

(51) Int. Cl.
*H01L 33/00* (2010.01)
*H01L 33/62* (2010.01)
(Continued)

(52) U.S. Cl.
CPC ............ *H01L 33/62* (2013.01); *H01L 25/167* (2013.01); *H01L 33/20* (2013.01); *H01L 33/486* (2013.01);
(Continued)

(58) Field of Classification Search
CPC ...................................... H01L 33/62
(Continued)

(56) References Cited

U.S. PATENT DOCUMENTS 6,531,328 B1 * 3/2003 Chen .................. H01L 24/97
                                                    438/106
6,600,175 B1   7/2003 Baretz et al.
(Continued)

FOREIGN PATENT DOCUMENTS

CN        1832212        9/2006
EP       2 148 369       1/2010
(Continued)

OTHER PUBLICATIONS

European Search Reportd dated Oct. 26, 2012 issued in Application No. 12 16 0149.6.
(Continued)

*Primary Examiner* — Theresa T Doan
(74) *Attorney, Agent, or Firm* — KED & Associates, LLP

(57) ABSTRACT

Disclosed are a light emitting device package. The light emitting device package includes a body having recess; a first lead frame including a first and second portions on a first region of the body; a second lead frame including a third and fourth portions on a second region of the body; a third lead frame between the first and second lead frame. The body has a length of the first direction greater than a width of the second direction, wherein the second portion of the first lead frame extends toward the second lead frame and has a small width, and wherein the fourth portion of the second lead frame extends toward the first lead frame. A first light emitting device is disposed on the first portion of the first lead frame and a second light emitting device is disposed on the third portion of the second lead frame.

20 Claims, 11 Drawing Sheets

Related U.S. Application Data continuation of application No. 15/299,307, filed on Oct. 20, 2016, now Pat. No. 9,728,525, which is a continuation of application No. 14/853,081, filed on Sep. 14, 2015, now Pat. No. 9,515,058, which is a continuation of application No. 13/891,014, filed on May 9, 2013, now Pat. No. 9,136,451, which is a division of application No. 13/346,320, filed on Jan. 9, 2012, now Pat. No. 8,455,891.

(51) Int. Cl.
| | | |
|---|---|---|
| *H01L 33/64* | (2010.01) | |
| *H01L 25/16* | (2006.01) | |
| *H01L 33/20* | (2010.01) | |
| *H01L 33/50* | (2010.01) | |
| *H01L 33/48* | (2010.01) | |

(52) U.S. Cl.
CPC .......... *H01L 33/502* (2013.01); *H01L 33/64* (2013.01); *H01L 33/642* (2013.01); *H01L 33/647* (2013.01); *H01L 2224/48137* (2013.01); *H01L 2924/1301* (2013.01); *H01L 2924/3025* (2013.01)

(58) Field of Classification Search
USPC .................. 257/88, 98, 99, 676; 437/123
See application file for complete search history.

(56) References Cited

U.S. PATENT DOCUMENTS

| | | | |
|---|---|---|---|
| 6,995,510 | B2 | 2/2006 | Murakami et al. |
| 7,566,912 | B2 | 7/2009 | Lee et al. |
| 7,812,364 | B2 | 10/2010 | Seko et al. |
| 8,283,675 | B2 | 10/2012 | Ohta et al. |
| 8,455,891 | B2 | 6/2013 | Lee |
| 10,333,040 | B2 | 6/2019 | Kobayakawa et al. |
| 2006/0202210 | A1 | 9/2006 | Mok et al. |
| 2006/0267040 | A1 | 11/2006 | Baek et al. |
| 2007/0029564 | A1 | 2/2007 | Han et al. |
| 2007/0145403 | A1 | 6/2007 | Tomioka et al. |
| 2007/0176190 | A1 | 8/2007 | Takayama |
| 2007/0194422 | A1 | 8/2007 | Lai et al. |
| 2007/0247841 | A1 | 10/2007 | Kono et al. |
| 2008/0012125 | A1 | 1/2008 | Son |
| 2008/0230790 | A1 | 9/2008 | Seko et al. |
| 2008/0259598 | A1 | 10/2008 | Sumitani et al. |
| 2009/0001393 | A1 | 1/2009 | Seo et al. |
| 2009/0224271 | A1 | 9/2009 | Seo et al. |
| 2009/0230413 | A1 | 9/2009 | Kobayakawa et al. |
| 2009/0289274 | A1 | 11/2009 | Park |
| 2010/0270571 | A1 | 10/2010 | Seo |
| 2012/0273833 | A1* | 11/2012 | Chen ................... H01L 25/167 257/99 |

FOREIGN PATENT DOCUMENTS

| | | |
|---|---|---|
| JP | H10-256610 | 9/1998 |
| JP | H11-054804 | 2/1999 |
| JP | 2000-058924 | 2/2000 |
| JP | 2002-252373 | 9/2002 |
| JP | 2007-027535 | 2/2007 |
| JP | 2007-180227 | 7/2007 |
| JP | 2008-270305 | 11/2008 |
| JP | 2009-044116 | 2/2009 |
| JP | 2009-135379 | 6/2009 |
| JP | 2010-098276 | 4/2010 |
| JP | 2010-226118 | 10/2010 |
| JP | 2011-233671 | 11/2011 |
| KR | 10-2008-0089041 | 10/2008 |
| KR | 10-2009-0121956 | 11/2009 |
| WO | WO 2007/108667 | 9/2007 |
| WO | WO 2009/072757 | 6/2009 |

OTHER PUBLICATIONS

United States Notice of Allowance dated Feb. 4, 2013 issued in U.S. Appl. No. 13/346,320.
United States Office Action dated Jan. 30, 2015 issued in U.S. Appl. No. 13/891,014.
Japanese Office Action dated Nov. 5 2015 issued in Application No. 2012-049714.
European Search Report dated Feb. 1, 2016 issued in Application No. 15193283.7.
United States Notice of Allowance dated Jul. 28, 2016 issued in U.S. Appl. No. 14/853,081.
United States Notice of Allowance dated Mar. 24, 2017 issued in U.S. Appl. No. 15/299,307.
Japanese Office Action dated Feb. 6, 2018 issued in Application No. 2017-055268.
European Search Report dated Mar. 2, 2018 issued in Application No. 17204875.3.
Chinese Office Action dated Sep. 5, 2018 issued in Application 201610961544.3 (full Chinese text).
Japanese Office Action dated Jul. 2, 2019 issued in Application 2018-166200.

* cited by examiner

ND LIGHT UNIT INCLUDING THE SAME

The present application is a Continuation of co-pending U.S. patent application Ser. No. 15/631,784 filed on Jun. 23, 2017, which is a continuation of U.S. patent application Ser. No. 15/299,307 filed on Oct. 20, 2016, now U.S. Pat. No. 9,728,525, which is a continuation of U.S. patent application Ser. No. 14/853,081 filed on Sep. 14, 2015, now U.S. Pat. No. 9,515,058, which is a continuation of U.S. patent application Ser. No. 13/891,014 filed on May 9, 2013, now U.S. Pat. No. 9,136,451, which is a divisional of U.S. patent application Ser. No. 13/346,320 filed on Jan. 9, 2012, now U.S. Pat. No. 8,455,891, which claims priority under 35 U.S.C. § 119(a) of Korean Patent Application No. 10-2011-0064097 filed on Jun. 29, 2011, which is hereby incorporated by reference in its entirety.

BACKGROUND

The embodiment relates to a light emitting device package and a light unit including the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response speed, safety and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

DETAILED DESCRIPTION OF THE EMBODIMENTS

Figure 1:
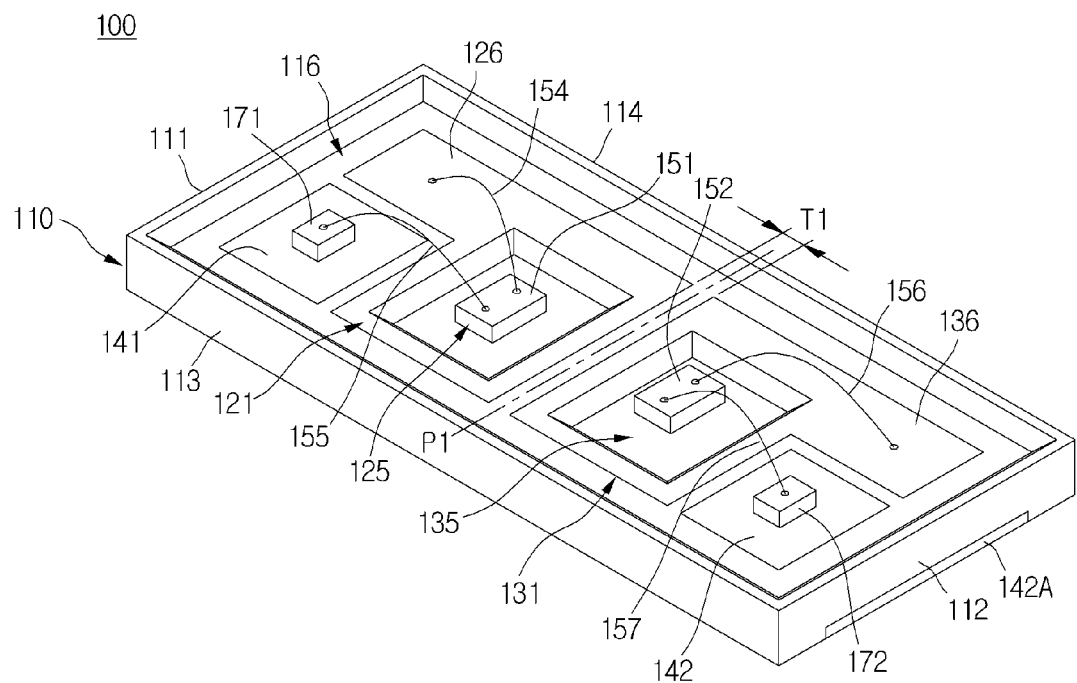
FIG. 1 is a perspective view showing a light emitting device package according to the first embodiment.

Hereinafter, the embodiments will be described with reference to accompanying drawings in detail so that those skilled in the art to which the invention pertains can easily realize the embodiments. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size. The same reference numerals will be assigned to the same elements throughout the drawings. Hereinafter, a light emitting device package according to the embodiment will be described with reference to accompanying drawings.

Figure 2:
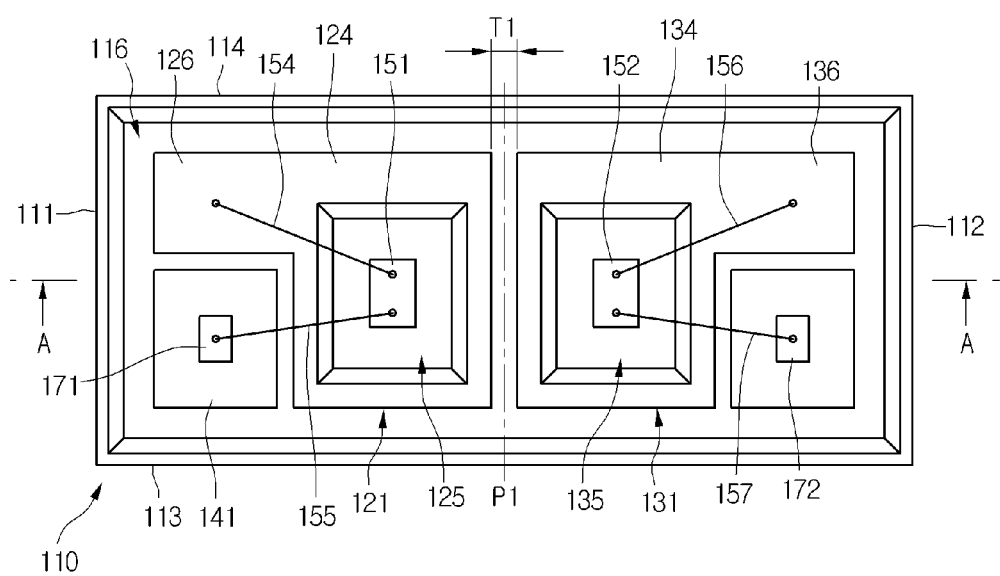
FIG. 2 is a plan view of a light emitting device package shown in FIG. 1.
Figure 3:
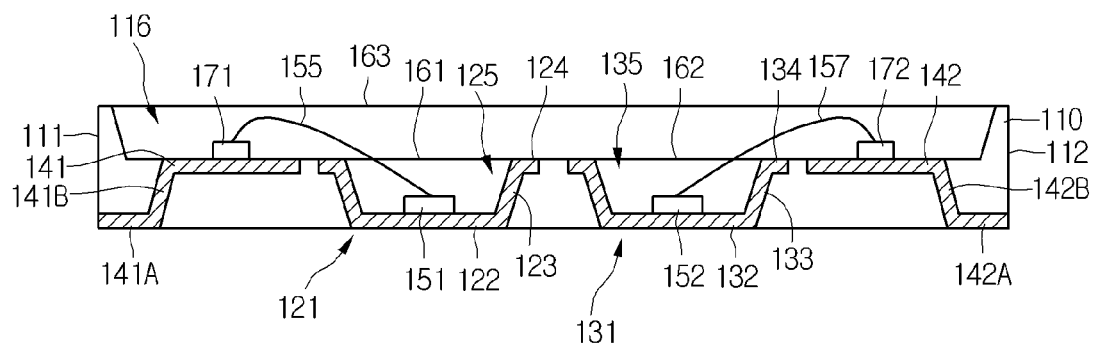
FIG. 3 is a sectional view taken along line A-A of FIG. 2.

FIG. 1 is a perspective view showing a light emitting device package according to the first embodiment, FIG. 2 is a plan view of the light emitting device package shown in FIG. 1, and FIG. 3 is a sectional view taken along line A-A of FIG. 2.

Referring to FIGS. 1 to 3, the light emitting device package 100 includes a body 110, a first lead frame 121 having a first cavity 125, a second lead frame 131 having a second cavity 135, a third lead frame 141, a fourth lead frame 142, a first light emitting device 151, a second light emitting device 152, a first protective device 171, a second protective device 172, and connection members 154 to 157.

The body 110 includes an insulating material or a conductive material. For instance, the body 110 includes at least one of a resin material, such as PPA (Polyphthalamide), Si, a metallic material, PSG (photosensitive glass), $Al_2O_3$, and PCB. The body 110 may include a resin material having a high reflectivity, such as PPA (Polyphthalamide).

The body 110 can be formed by using a material having electric conductivity. In this case, an insulating layer (not shown) is formed on a surface of the body 110 to prevent the electric short between the body 110 and the first and second lead frames 121 and 131.

The body 110 includes a plurality of lateral sides 111 to 114, in which at least one of the lateral sides 111 to 114 is vertical or inclined to a lower surface of the body 110. The lateral sides 111 to 114 of the body 110 may be vertical or inclined to the lower surface of the body 110 and widths of the first and second lateral sides 111 and 112 may be different from widths of the third and fourth lateral sides 113 and 114. The widths of the first and second lateral sides 111 and 112 may correspond to the distance between the third and fourth lateral sides 113 and 114 and the widths of the third and fourth lateral sides 113 and 114 may correspond to the distance between the first and second lateral sides 111 and 112. When viewed from the top, the body 110 may have various external shapes, such as a triangle, a rectangle, a polygon and a circle according to the application and the design of the light emitting device package 100.

The body 110 includes first to fourth lateral sides 111 to 114, in which the first and second lateral sides 111 and 112 are opposite to each other, and the third and fourth lateral sides 113 and 114 are opposite to each other. A width or a length of the first and second lateral sides 111 and 112 may be equal to or different from a width or a length of the third and fourth lateral sides 113 and 114. For instance, the length of the first and second lateral sides 111 and 112 may be shorter than the length of the third and fourth lateral sides 113 and 114. The body 110 has a polygonal structure, for instance, a hexahedral structure, but the embodiment is not limited thereto.

An upper portion 116 of the body 110 is formed with an open region. The open region is formed in an area of the first and second cavities 125 and 135. The first and second cavities 125 and 135 are spaced apart from each other to emit the light.

The first lead frame 121 forms the first cavity 125 defined by a heat dissipation part 122 and an inclined part 123 between the heat dissipation part 122 and a top surface part 124. The heat dissipation part 122 of the first lead frame 121 is exposed to the lower surface of the body 110 and disposed on the same plane with the lower surface of the body 110. The heat dissipation part 122 serves as a lead. The heat dissipation part 122 of the first lead frame 121 is physically/electrically connected to a heat dissipation plate or a metal pad of a substrate to perform the heat conductive function.

The first cavity 125 has the cup shape or the recess shape concaved down from the top surface part 124 of the first lead frame 121.

The second lead frame 131 forms the second cavity 135 defined by a heat dissipation part 132 and an inclined part 133 between the heat dissipation part 132 and a top surface part 134. The heat dissipation part 132 of the first lead frame 131 is exposed to the lower surface of the body 110 and disposed on the same plane with the lower surface of the body 110. The heat dissipation part 132 serves as a lead. The heat dissipation part 132 of the second lead frame 131 is physically/electrically connected to a heat dissipation plate or a metal pad of a substrate to perform the heat conductive function.

The second cavity 135 has the cup shape or the recess shape concaved down from the top surface part 134 of the second lead frame 131.

The first and second lead frames 121 and 131 are spaced apart from each other by a predetermined interval T1. The first cavity 125 of the first lead frame 121 and the second cavity 135 of the second lead frame 131 are closer to the center line P1 of the body 110 than to the first and second lateral sides 111 and 112 of the body 110. Since the first and second cavities 125 and 135 are closer to the center line P1 on the top surface of the body 110, the intensity of the light emitted from the light emitting device package 100 can be enhanced.

The first lead frame 121 includes a first bonding part 126 between the first cavity 125 and the first lateral side 111. The first bonding part 126 is disposed at a corner defined by the first and fourth lateral sides 111 and 114 of the body 110.

The second lead frame 131 includes a second bonding part 136 between the second cavity 135 and the second lateral side 112. The second bonding part 136 is disposed at a corner defined by the second and third lateral sides 112 and 113 of the body 110.

The third lead frame 141 is disposed between the first cavity 125 of the first lead frame 121 and the first lateral side 111 of the body 110. When viewed from the top of the body 110, the third lead frame 141 is closer to the first lead frame 121 than to the second lead frame 131 and disposed at the corner defined by the first and third lateral sides 111 and 113 of the body 110. The third lead frame 141 is disposed corresponding to the first bonding part 126 of the first lead frame 121. A first protective device 171 is mounted on the third lead frame 141 and electrically connected to the third lead frame 141.

The fourth lead frame 142 is disposed between the second cavity 135 of the second lead frame 131 and the second lateral side 112 of the body 110. When viewed from the top of the body 110, the fourth lead frame 142 is closer to the second lead frame 131 than to the first lead frame 121 and disposed at the corner defined by the second and third lateral sides 112 and 113 of the body 110. The fourth lead frame 142 is disposed corresponding to the second bonding part 136 of the second lead frame 131. A second protective device 172 is mounted on the fourth lead frame 142 and electrically connected to the fourth lead frame 142.

The first to fourth lead frames 121, 131, 141 and 142 are physically spaced apart from each other. The first to fourth lead frames 121, 131, 141 and 142 may have the same thickness, but the embodiment is not limited thereto.

The first to fourth lead frames 121, 131, 141 and 142 may include at least one selected from the group consisting of Ti, Cu, Ni, Au, Cr, Ta, Pt, Sn, Ag, and P. In addition, the first to fourth lead frames 121, 131, 141 and 142 can be formed of homogeneous metal layers or heterogeneous metal layers, and the embodiment is not limited thereto.

At least one first light emitting device 151 is disposed in the first cavity 125. The first light emitting device 151 is attached onto the heat dissipation part 122 of the first cavity 125 and connected the first bonding part 126 and the first protective device 171 through the first and second connection members 154 and 155, respectively. The first protective device 171 can be electrically connected to one of the first light emitting device 151 and the first lead frame 121.

At least one second light emitting device 152 is disposed in the second cavity 135. The second light emitting device 152 is attached onto the heat dissipation part 132 of the second cavity 135 and connected the second bonding part 136 and the second protective device 173 through the third and fourth connection members 156 and 157, respectively. The first to fourth connection members 154 to 157 may include wires. The second protective device 172 can be electrically connected to one of the second light emitting device 152 and the second lead frame 131.

Since one ends of the first to fourth connection members 154 to 157 are spaced apart from the first and second cavities 125 and 135, the widths of the first and second cavities 125 and 135 can be reduced because it is not necessary to provide to the space for bonding the connection members.

The first and second light emitting devices 151 and 152 are disposed at centers of the cavities 125 and 135, respectively, in line with each other.

The first and second lead frames 121 and 131 may have the symmetrical structure about the center line P1 of the body 110. In addition, the first and second lead frames 121 and 131 may have the point symmetrical structure or the asymmetrical structure. The third and fourth lead frames 141 and 142 may have the symmetrical structure about the center line P1 of the body 110. In addition, the third and fourth lead frames 141 and 142 may have the point symmetrical structure or the asymmetrical structure.

The centers of the first and second light emitting devices 151 and 152 are in line with each other and the first and second bonding parts 126 and 136 are disposed in opposition to each other at the upper portion of the body 110 while being spaced apart from each other by a predetermined interval greater than the interval between the first and second cavities 125 and 135. In addition, the third and fourth lead frames 141 and 142 are disposed in opposition to each other at the upper portion of the body 110 while being spaced apart from each other by a predetermined interval greater than the interval between the first and second cavities 125 and 135.

The first bonding part 126 is disposed at the corner of the first lead frame 121 and the second bonding part 136 is disposed at the corner of the second lead frame 131.

The interval between the first and second light emitting devices 151 and 152 is smaller than the interval between the first and second protective devices 171 and 172.

As shown in FIGS. 1 to 3, the third lead frame 141 extends from an upper portion of the body 110 to a lower surface of the body 110. The third lead frame 141 includes a first lead part 141A disposed on the lower surface of the body 110 and an inclined part 141B extending to the upper portion of the body 110 from the first lead part 141A. The third lead frame 141 receives the power through the first lead part 141A. The first lead part 141A is exposed at the lower portion of the first lateral side 111 of the body 110 and has a width wider than a width of an upper portion of the third lead frame 141 and smaller than a width of the lower surface of the body 110.

In addition, the fourth lead frame 142 extends from an upper portion of the body 110 to the lower surface of the body 110. The fourth lead frame 142 includes a second lead part 142A disposed on the lower surface of the body 110 and an inclined part 142B extending to the upper portion of the body 110 from the second lead part 142A. The fourth lead frame 142 receives the power through the second lead part 142A. The second lead part 142A is exposed at the lower portion of the second lateral side 112 of the body 110 and has a width wider than a width of an upper portion of the fourth lead frame 142 and smaller than a width of the lower surface of the body 110.

A material for the body 110 can be further formed in the top surfaces of the first and second lead frames 121 and 131 except for the region where the first and second cavities 125 and 135 are connected to the connection members, but the embodiment is not limited thereto. In addition, at least one hole may be formed in the first and second lead frames 121 and 131 to reinforce the coupling strength with respect to the body 110. Further, at least one of the first to fourth lead frames 121, 131, 141 and 142 can be formed on a top surface or a lower surface thereof with a concavo-convex structure to increase the contact area with respect to the body 110.

In addition, a material for the body 110 can be further formed in the top surfaces of the third and fourth lead frames 141 and 142 except for the region where the protective devices are formed, but the embodiment is not limited thereto.

The first and second light emitting devices 151 and 152 may selectively emit the light having the wavelength band in the range of the ultraviolet band to the visible band. In addition, the first and second light emitting devices 151 and 152 may emit the lights having the same main peak wavelength or the different main peak wavelengths. The first and second light emitting devices 151 and 152 may include an LED chip employing group III-V compound semiconductors. For instance, the first and second light emitting devices 151 and 152 may include at least one of a UV (ultraviolet) LED chip, a blue LED chip, a green LED chip, a white LED chip and a red LED chip.

Figure 15:
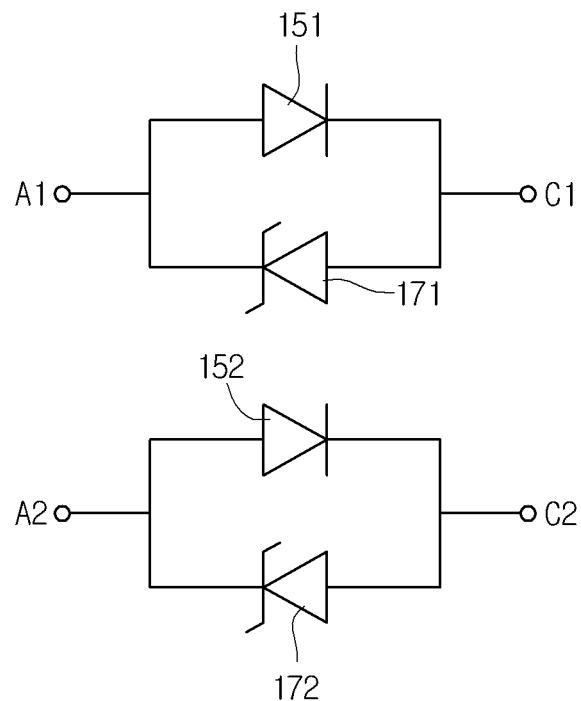
FIG. 15 is a circuit view of a light emitting device package shown in FIG. 1.

As shown in FIG. 15, the first protective device 171 is inverse-parallel connected to the first light emitting device 151 to protect the first light emitting device 151 in the light emitting device package. The second protective device 172 is inverse-parallel connected to the second light emitting device 152 to protect the second light emitting device 152 in the light emitting device package. The first and second protective device 171 and 172 may selectively include a Zener diode, a thyristor, or a TVS (transient voltage suppression) diode.

Since the first and second light emitting devices 151 and 152 are disposed in the first and second cavities 125 and 135 while being separated from each other, the electric tests for the first and second light emitting devices 151 and 152, such as the measurement of forward voltage Vf or light information, can be effectively performed. If the first and second light emitting devices 151 and 152 are electrically connected to each other, the reliability of the test may be degraded due to the electric interference and one may exert an influence upon the other.

Referring to FIG. 3, a first molding member 161 covering the first light emitting device 151 and a second molding member 162 covering the second light emitting device 152 are disposed in the first cavity 125. In addition, a third molding member 163 is provided at the upper portion 116 of the body 110. The first to third molding members 161, 162 and 163 can be formed of a single layer, individual layers or at least two layers. A top surface of at least one of the first to third molding members 161, 162 and 163 may be flat, concave or convex, but the embodiment is not limited thereto.

The first and second molding members 161 and 162 can be prepared by using the same transmittive material, but the embodiment is not limited thereto. At least one of the first to third molding members 161, 162 and 163 may include phosphors to convert the wavelength of the light emitted from the first light emitting device 151 and/or the second light emitting device 152. The phosphor is excited by a part of the light emitted from the first and second light emitting devices 151 and 152 so that the wavelength of the light can be converted. For instance, if the first and second light emitting devices 151 and 152 are blue LEDs and the phosphor is a yellow phosphor, the yellow phosphor is excited by the blue light so that the white light may be generated. If the first and second light emitting devices 151 and 152 emit the UV light, red, green and blue phosphors are added to the first and second molding members 161 and 162 to generate the white light. The same type or different types of phosphors may be added to the first and second molding members 161 and 162, and the embodiment is not limited thereto.

A lens can be formed on the body 110. The lens may include a concave lens and/or a convex lens and can adjust the distribution of the light emitted from the light emitting device package 100.

The elements of the first embodiment and description thereof may be applicable for other embodiments by reference.

Figure 4:
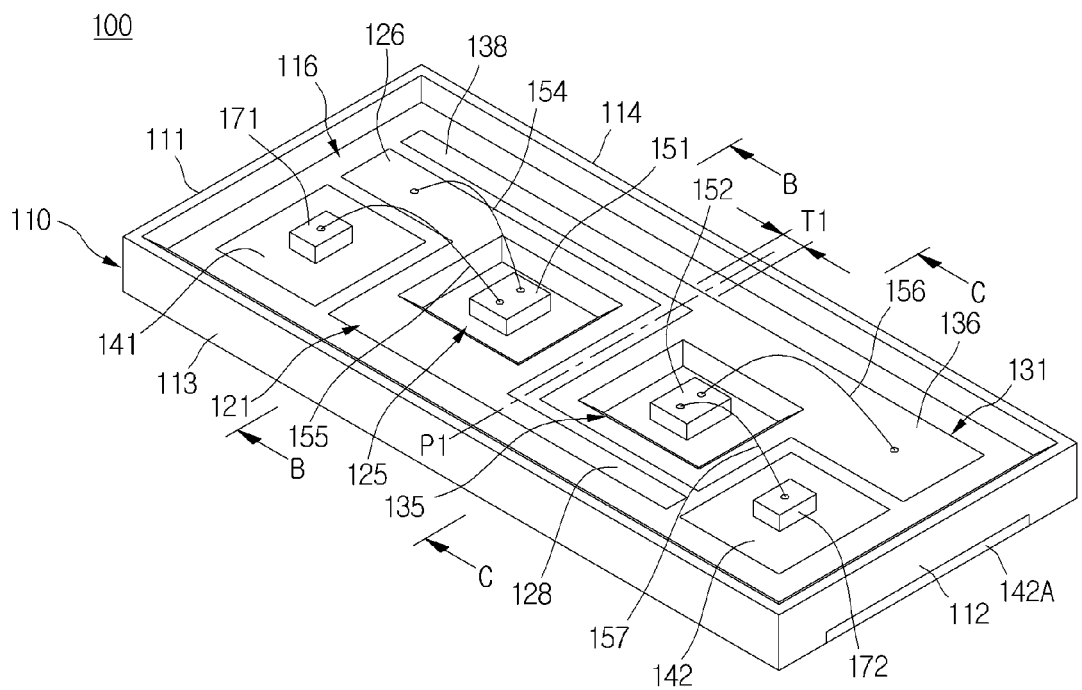
FIG. 4 is a perspective view showing a light emitting device package according to the second embodiment.
Figure 5:
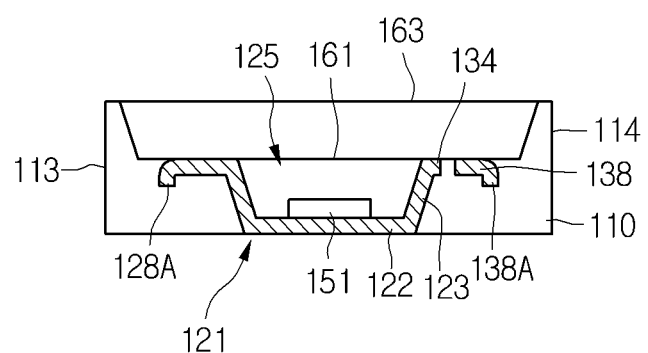
FIG. 5 is a sectional view taken along line B-B of FIG. 4.
Figure 6:
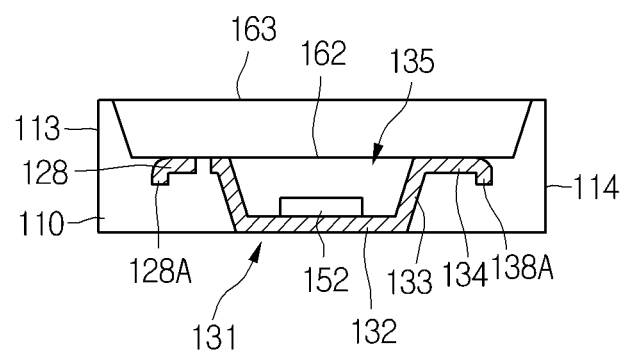
FIG. 6 is a sectional view taken along line C-C of FIG. 4.

FIGS. 4 to 6 are second embodiment.

FIG. 4 is a perspective view showing a light emitting device package according to the second embodiment, FIG. 5 is a sectional view taken along line B-B of FIG. 4, and FIG. 6 is a sectional view taken along line C-C of FIG. 4. In the following description about the second embodiment, the elements and structures that have been described in the first embodiment may not be explained in detail in order to avoid redundancy.

Referring to FIGS. 4 to 6, the light emitting device package 100 includes a body 110, a first lead frame 121 having a first cavity 125, a second lead frame 131 having a second cavity 135, a third lead frame 141, a fourth lead frame 142, a first light emitting device 151, a second light emitting device 152, a first protective device 171, a second protective device 172, and connection members 154 to 157.

The first lead frame 121 includes a first rib 128 and the second lead frame 131 includes a second rib 138. The first rib 128 protrudes from the first lead frame 121 and is disposed between the second lead frame 131 and the third lateral side 113 at the upper portion of the body 110 and an end of the first rib 128 is closer to the second cavity 135 than to the first cavity 125. The second rib 138 protrudes from the second lead frame 121 and is disposed between the first lead frame 121 and the fourth lateral side 114 at the upper portion of the body 110 and an end of the second rib 138 is closer to the first cavity 125 than to the second cavity 135. The first and second ribs 128 and 138 cross the center region of the body 110 so that the tensile strength can be reinforced at the center region of the body 110. Since the first and second lead frames 121 and 131 are spaced apart from each other at the center region of the body 110, the center region of the body 110 may be easily broken as external impact is applied thereto. To solve this problem, the first and second ribs 128 and 138 reinforce the tensile strength at the center region of the body 110, so the reliability of the light emitting device package can be improved.

Referring to FIGS. 5 and 6, a first protrusion 128A is formed at an outer portion of the first lead frame 121 and the first rib 128. The first protrusion 128A protrudes downward from the top surface of the first lead frame 121. The first protrusion 128A protrudes between the first cavity 125 and the third lateral side 113 of the body 110 from the top of the first lead frame 121. A second protrusion 138A is formed at an outer portion of the second lead frame 131 and the second rib 138. The second protrusion 138A protrudes downward from the top of the second lead frame 131. The second protrusion 138A protrudes between the second cavity 135 and the fourth lateral side 114 of the body 110 from the top of the second rib 138. The first and second ribs 128 and 138 protrude in opposition to each other about the center of the body 110, and the tensile strength can be reinforced at the center region of the body 110 due to the first and second protrusions 128A and 138A.

Figure 7:
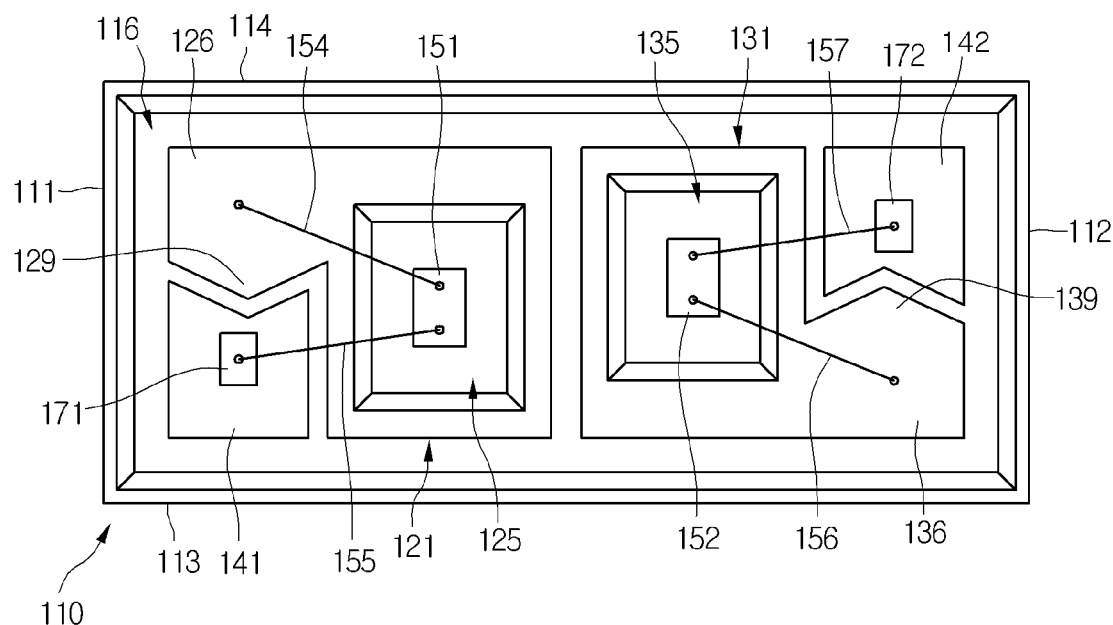
FIG. 7 is a plan view showing a light emitting device package according to the third embodiment.

FIG. 7 is a plan view showing a light emitting device package according to the third embodiment.

Referring to FIG. 7, the light emitting device package includes a body 110, a first lead frame 121 having a first cavity 125, a second lead frame 131 having a second cavity 135, a third lead frame 141, a fourth lead frame 142, a first light emitting device 151, a second light emitting device 152, a first protective device 171, a second protective device 172, and connection members 154 to 157.

A first bonding part 126 of the first lead frame 121 and a second bonding part 136 of the second lead frame 131 are diagonally arranged about the center region of the body 110. In addition, the third and fourth lead frames 141 and 142 are diagonally arranged about the center region of the body 110. A part 129 of the first bonding part 126 of the first lead frame 121 further protrudes toward the lateral side of the third lead frame 141. For instance, the part 129 of the first bonding part 126 has the concavo-convex structure to increase the heat dissipation area. A part 139 of the second bonding part 136 of the second lead frame 131 further protrudes toward the lateral side of the fourth lead frame 142. For instance, the part 139 of the second bonding part 136 has the concavo-convex structure to increase the heat dissipation area.

Figure 8:
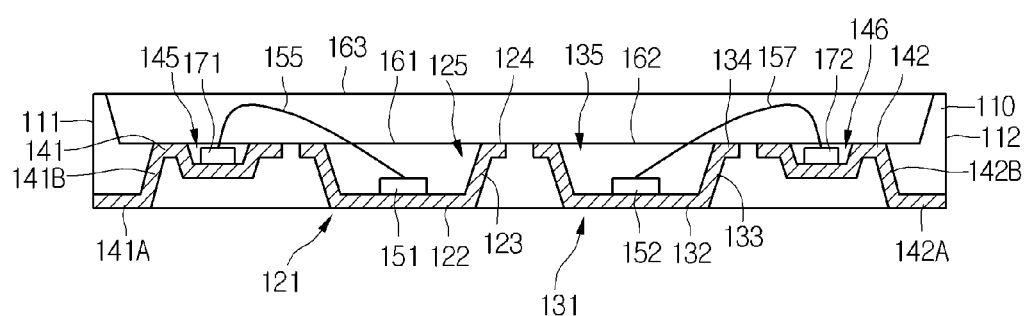
FIG. 8 is a side sectional view showing a light emitting device package according to the fourth embodiment.

FIG. 8 is a side sectional view showing a light emitting device package according to the fourth embodiment.

Referring to FIG. 8, the light emitting device package includes a body 110, a first lead frame 121 having a first cavity 125, a second lead frame 131 having a second cavity 135, a third lead frame 141, a fourth lead frame 142, a first light emitting device 151, a second light emitting device 152, a first protective device 171, a second protective device 172, and connection members 154 to 157.

A third cavity 145 is formed on at an upper portion of the third lead frame 141 and a first protective device 171 is disposed on the bottom surface of the third cavity 145. A fourth cavity 146 is formed at an upper portion of the fourth lead frame 142 and a second protective device 172 is disposed on the bottom surface of the fourth cavity 146. The depth of the third and fourth cavities 145 and 146 may correspond to the thickness of the first and second protective devices 171 and 172. In detail, the depth of the third and fourth cavities 145 and 146 is in the range of 50 μm to 200 μm. The depth of the third and fourth cavities 145 and 146 is lower than the depth of the first and second cavities 125 and 135 when measured from the top surface of the body 110.

At least a part of the first and second protective devices 171 and 172 is disposed in the third and fourth cavities 145 and 146, so the loss of the light emitted from the light emitting devices 151 and 152 can be reduced.

Figure 9:
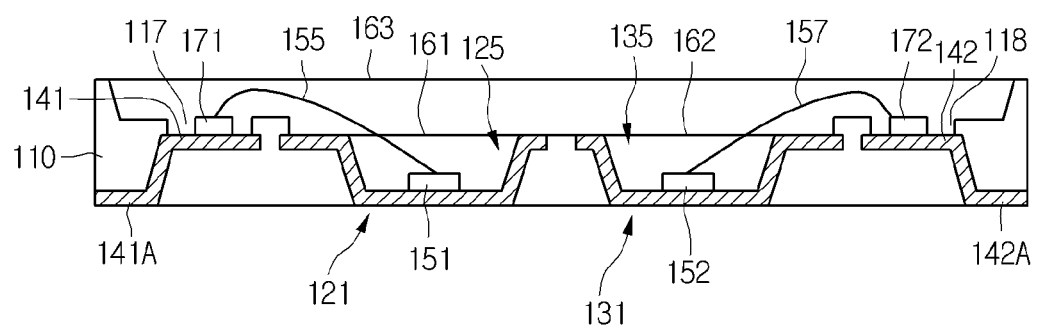
FIG. 9 is a side sectional view showing a light emitting device package according to the fifth embodiment.

FIG. 9 is a side sectional view showing a light emitting device package according to the fifth embodiment.

Referring to FIG. 9, the light emitting device package includes a body 110 and first and second recess parts 117 and 118, which are formed at an upper portion of the body 110 with a step structure higher or lower than the top surface of the body 110. A top surface of a third lead frame 141 is exposed in the first recess part 117 and a first protective device 171 is mounted on the third lead frame 141 disposed in the first recess part 117. A top surface of a fourth lead frame 142 is exposed in the second recess part 118 and a second protective device 172 is mounted on the fourth lead frame 142 disposed in the second recess part 118.

Figure 10:
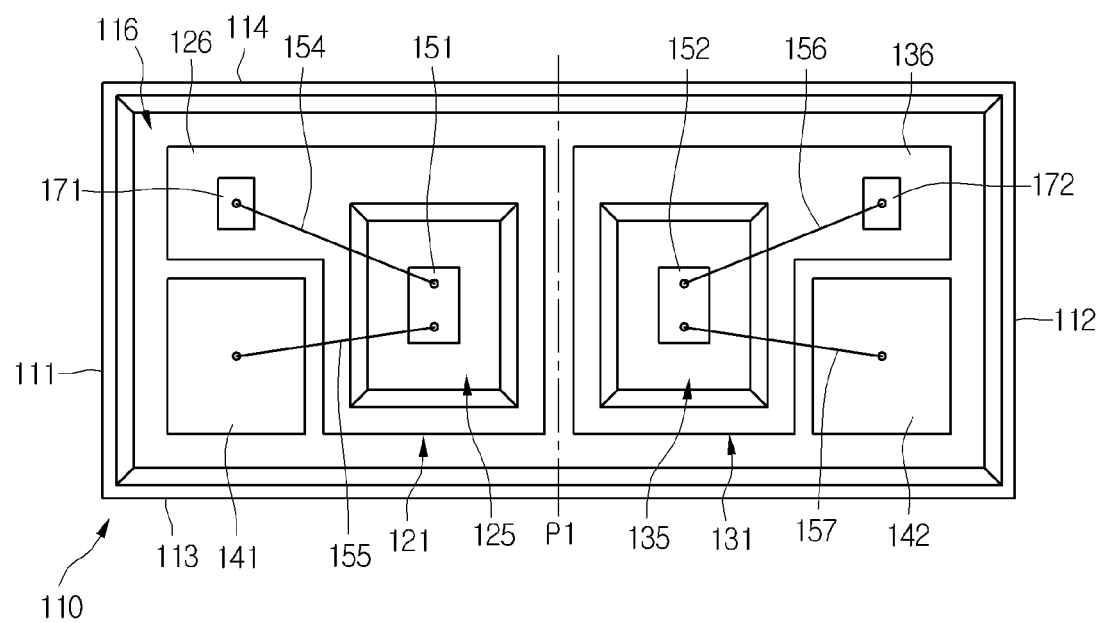
FIG. 10 is a plan view showing a light emitting device package according to the sixth embodiment.

FIG. 10 is a plan view showing a light emitting device package according to the sixth embodiment.

Referring to FIG. 10, a first protective device 171 is mounted on a first bonding part 126 of a first lead frame 121 and connected to a first light emitting device 151 through a first connection member 154. A third lead frame 141 is connected to the first light emitting device 151 by a second connection member 155. Since the protective device is not mounted on the third lead frame 141, an area for bonding the connection member is in the range of 100 μm to 200 μm in length and width, respectively. The first and second connection members 154 and 155 may include wires.

Figure 11:
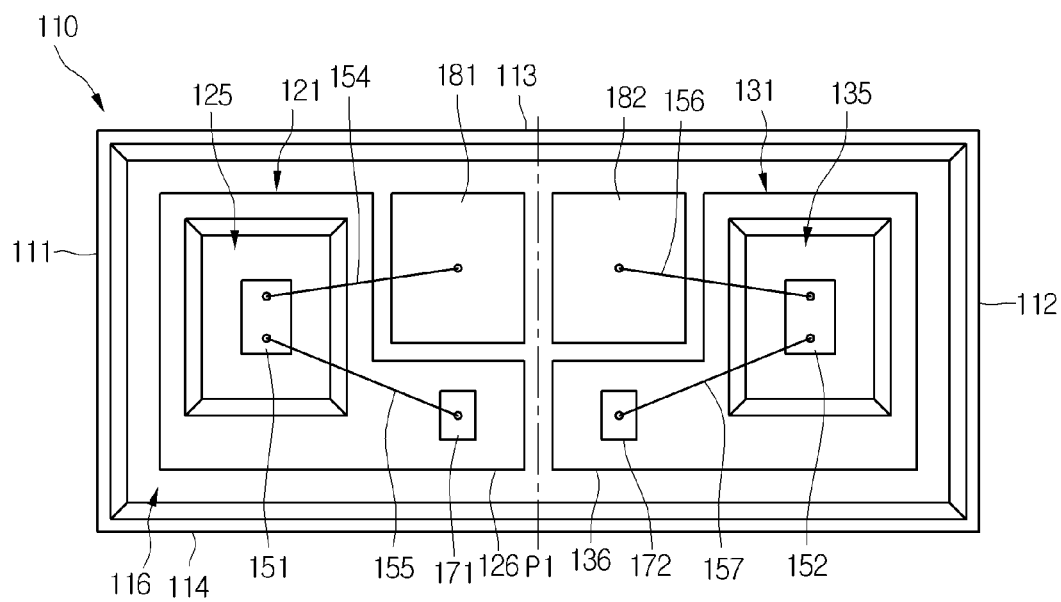
FIG. 11 is a plan view showing a light emitting device package according to the seventh embodiment.

FIG. 11 is a plan view showing a light emitting device package according to the seventh embodiment.

Referring to FIG. 11, a first light emitting device 151 is spaced apart from a second light emitting device 152 as far as possible in the light emitting device package. A first bonding part 126 of a first lead frame 121 and a second bonding part 136 of a second lead frame 131 are arranged corresponding to a first region of a center line P1 of a body 110, and a third lead frame 181 and a fourth lead frame 182 are arranged corresponding to a second region of a center line P1 of the body 110. Lead parts of the third lead frame 181 and the fourth lead frame 182 may be disposed below the third lateral side of the body 110, but the embodiment is not limited thereto.

The third lead frame 181 is disposed between the first and second cavities 125 and 135 or between the first bonding part 126 and a third lateral side 113 of a body 110. The fourth lead frame 182 is disposed between the third lead frame 181 and the second cavity 135 or between the second bonding part 136 and the third lateral side 113 of the body 110.

The first bonding part 126 of the first lead frame 121 is disposed between the third lead frame 181 and a fourth lateral side 114 of the body 110, and the second bonding part 136 of the second lead frame 131 is disposed between the fourth lead frame 182 and the fourth lateral side 114 of the body 110.

A first protective device 171 may be disposed on the first bonding part 126 of the first lead frame 121 and electrically connected to the first light emitting device 151 by a first connection member 154. A second protective device 172 may be disposed on the second bonding part 136 of the second lead frame 131 and electrically connected to the second light emitting device 152 by a fourth connection member 157.

The first cavity 125 is closer to a first lateral side 111 of the body 110 than to the center line P1 of the body 110, and the second cavity 135 is closer to a second lateral side 112 of the body 110 than to the center line P1 of the body 110.

Otherwise, the first protective device 171 may be disposed on the third lead frame 181 and electrically connected to the first light emitting device 151, and the second protective device 172 may be disposed on the fourth lead frame 182 and electrically connected to the second light emitting device 152. At least one of the first to fourth lead frames 121, 131, 181 and 182 may be provided with a hole or a concavo-convex structure, but the embodiment is not limited thereto.

An interval between the first and second light emitting devices 151 and 152 may be wider than an interval between the first and second protective devices 171 and 172.

At least a part of the first to fourth lead frames 121, 131, 181 and 182 may be exposed to at least one lateral side of the body 110, but the embodiment is not limited thereto.

Molding members can be disposed in the first and second cavities 125 and 135 and phosphors may be added to the molding members. The molding members may include transmittive resin materials, but the embodiment is not limited thereto.

Figure 12:
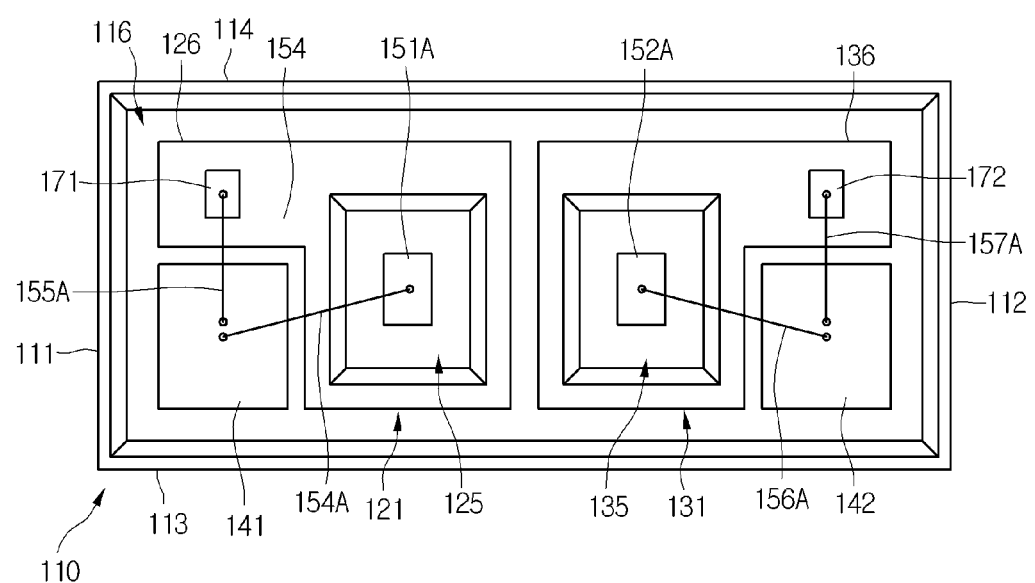
FIG. 12 is a plan view showing a light emitting device package according to the eighth embodiment.

FIG. 12 is a plan view showing a light emitting device package according to the eighth embodiment.

Referring to FIG. 12, a first light emitting device 151A having a vertical electrode structure is electrically connected to a first lead frame 121 through a first cavity 125 and to a third lead frame 141 through a first connection member 154A. A first protective device 171 mounted on a first bonding part 126 is connected to the third frame 141 through a second connection member 155A. A second light emitting device 152A having a vertical electrode structure is electrically connected to a second lead frame 131 through a second cavity 135 and to a fourth lead frame 142 through a third connection member 156A. A second protective device 172 mounted on a second bonding part 136 is connected to the fourth frame 142 through a fourth connection member 157A. The first and second light emitting devices 151A and 152A have the structure, in which the electrodes are disposed at lower portions thereof, and can be electrically connected to the first and second lead frames 121 and 131.

Figure 13:
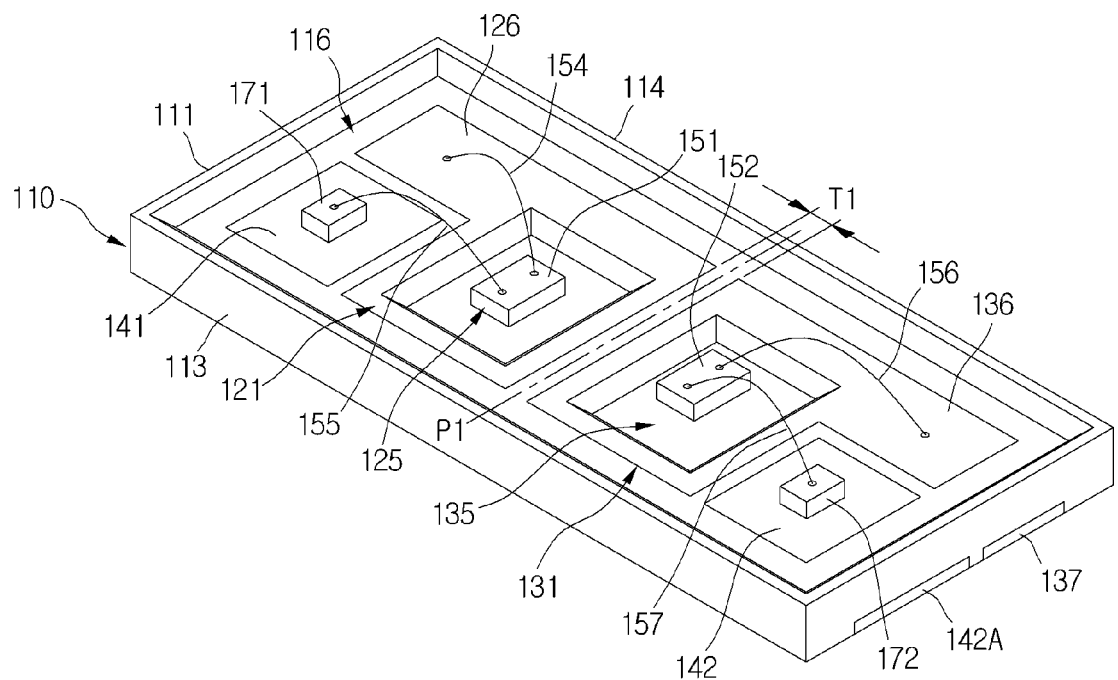
FIGS. 13 and 14 are a perspective view and a side sectional view of a light emitting device package according to the ninth embodiment, respectively.
Figure 14:
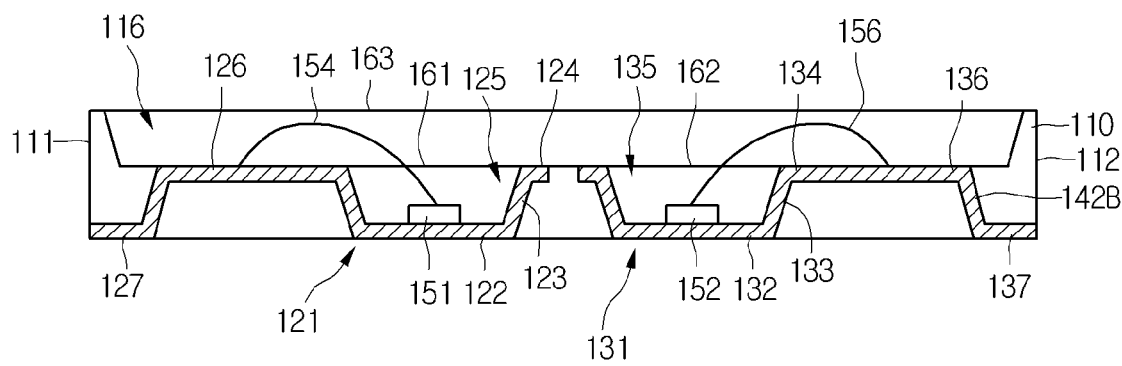

FIGS. 13 and 14 are side sectional views showing a light emitting device package according to the ninth embodiment. In the following description about the ninth embodiment, the elements and structures that have been described in the first embodiment may not be explained in detail in order to avoid redundancy.

Referring to FIGS. 13 and 14, the light emitting device package includes a body 110, a first lead frame 121 having a first cavity 125, a second lead frame 131 having a second cavity 135, a third lead frame 141, a fourth lead frame 142, a first light emitting device 151, a second light emitting device 152, a first protective device 171, a second protective device 172, and connection members 154 to 157.

The first lead frame 121 includes a third lead part 127, which is bent from a first bonding part 126 of the first lead frame 121 through the body 110 and exposed to a lower surface of the body 110 adjacent to a second lateral side 112 of the body 110. In addition, the third lead part 127 may protrude toward a first lateral side 111 of the body 110, but the embodiment is not limited thereto. In addition, as shown in FIGS. 2 and 14, a first lead part 141A of the third lead frame 141 and the third lead part 127 may be spaced apart from each other at the first lateral side 111 of the body 110 and may protrude from the first lateral side 111 of the body 110.

The second lead frame 131 includes a fourth lead part 137, which is bent from a second bonding part 136 of the second lead frame 131 through the body 110 and exposed to the lower surface of the body 110 adjacent to the second lateral side 112 of the body 110. In addition, the fourth lead part 137 may protrude toward a second lateral side 112 of the body 110, but the embodiment is not limited thereto. In addition, as shown in FIGS. 2 and 14, a second lead part 141B of the fourth lead frame 142 and the fourth lead part 137 may be spaced apart from each other at the second lateral side 112 of the body 110 and may protrude from the second lateral side 112 of the body 110.

The light emitting device packages according to first to ninth embodiments may have the circuit structure as shown in FIG. 15 to test the electrical reliability of each light emitting device.

Referring to FIG. 15, the first light emitting device 151 and the first protective device 171 are connected in parallel to each other between a first node A1 and a second node C1, and the second light emitting device 152 and the second protective device 172 are connected in parallel to each other between a third node A2 and a fourth node C2. The first and second nodes A1 and C1 are electrically open with respect to the third and fourth nodes A2 and C2, so that the electrical interference can be prevented.

Figure 16:
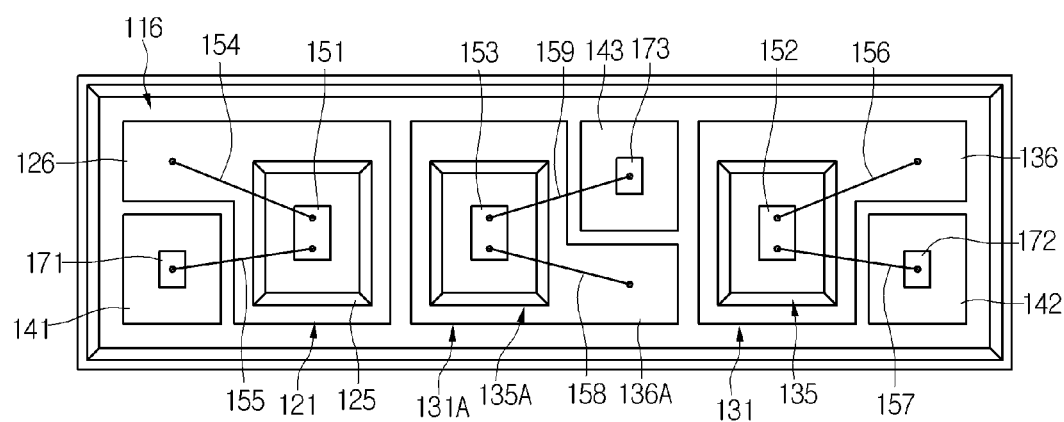
FIG. 16 is a plan view showing a light emitting device package according to the tenth embodiment.

FIG. 16 is a plan view showing a light emitting device package according to the tenth embodiment.

Referring to FIG. 16, the light emitting device package includes a body 110, a first lead frame 121 having a first cavity 125, a second lead frame 131 having a second cavity 135, a third lead frame 141, a fourth lead frame 142, a first light emitting device 151, a second light emitting device 152, a third light emitting device 153, a first protective device 171, a second protective device 172, and a third protective device 173.

Fifth and sixth lead frames 131A and 143 are disposed between the first lead frame 121 and the second lead frame 131. The fifth lead frame 131A has a fifth cavity 135A and the third light emitting device 153 is mounted in the fifth cavity 135A. The third protective device 173 is mounted on the sixth lead frame 143. The third light emitting device 153 is connected to a third bonding part 136A of the fifth lead frame 131A through a fifth connection member 158 and connected to the third protective device 173 through a sixth connection member 159. The fifth and sixth connection members 158 and 159 may include wires. The light emitting device package may include at least two light emitting devices arrayed in a single body and the light emitting devices may include LED chips capable of emitting the light having the same peak wavelength or emitting the light having various colors, but the embodiment is not limited thereto.

Figure 17:
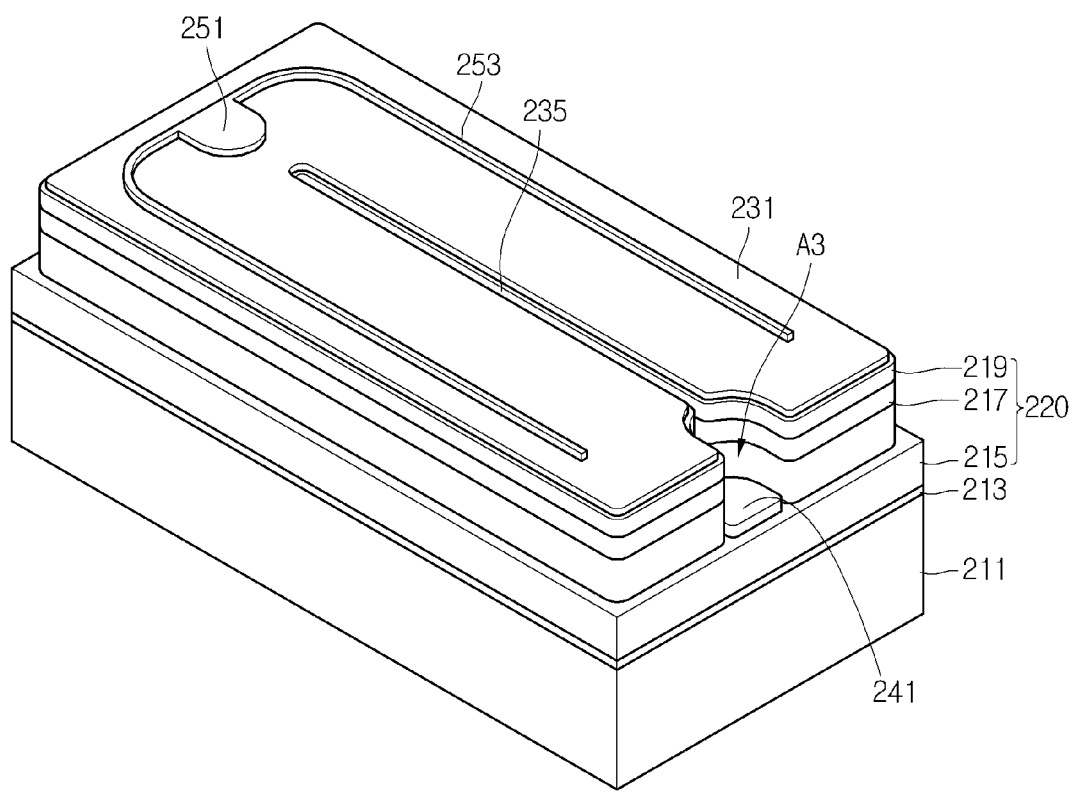
FIG. 17 is a perspective view showing an example of a light emitting device of a light emitting device package according to the embodiment.

FIG. 17 is a perspective view showing an example of a light emitting device of the light emitting device package according to the embodiment.

Referring to FIG. 17, the light emitting device includes a substrate 211, a buffer layer 213, a first conductive semiconductor layer 215, an active layer 217, a second conductive semiconductor layer 219, an electrode layer 231, a first electrode pad 241, and a second electrode pad 251.

The substrate 211 may include a transmittive substrate, an insulating substrate or a conductive substrate. For instance, the substrate 211 may include at least one of $Al_2O_3$, SiC, Si, GaAs, GaN, ZnO, Si, GaP, InP, Ge, $Ga_2O_3$ and $LiGaO_3$. A plurality of protrusions may be formed on a top surface of the substrate 211. The protrusions can be formed by etching the substrate 211 or a separate light extracting structure, such as a roughness, can be formed on the top surface of the substrate 211. The protrusions may have a stripe shape, a hemispheric shape or a dome shape. The substrate 211 may have a thickness in the range of 30 μm to 300 μm, but the embodiment is not limited thereto.

The buffer layer 213 may be formed on the substrate 211. The buffer layer 213 may be formed of at least one layer by using a group II-VI compound semiconductor. The buffer layer 213 may include a semiconductor layer formed by using the group III-V compound semiconductor. For instance, the buffer layer 213 may include a semiconductor layer having the compositional formula of $In_xAl_yGa_{1-x-y}N$ (0≤x≤1, 0≤y≤1, 0≤y≤1), such as GaN, InN, AlN, InGaN, AlGaN, InAlGaN, or AlInN. The buffer layer 213 may have the superlattice structure by alternately stacking heterogeneous semiconductor layers.

The buffer layer 213 may attenuate the lattice mismatch between the substrate 211 and the nitride semiconductor layer and may be defined as a defect control layer. The buffer layer 213 may have a lattice constant between a lattice constant of the substrate 211 and a lattice constant of the nitride semiconductor layer. The buffer layer 213 may be formed by using oxide, such as ZnO, but the embodiment is not limited thereto. The buffer layer 213 may have a thickness in the range of 30 nm to 500 nm, but the embodiment is not limited thereto.

A low-conductive layer is formed on the buffer layer 213. The low-conductive layer is an undoped semiconductor layer having conductivity lower than that of the first conductive semiconductor layer. The low-conductive layer can be formed by using the group III-V compound semiconductor, for instance, a GaN-based semiconductor. The undoped semiconductor layer has a first conductive property even if a conductive dopant is not intentionally doped during the manufacturing process. The undoped semiconductor layer may be omitted, and the embodiment is not limited thereto.

The first conductive semiconductor layer 215 is formed on the buffer layer 213. The first conductive semiconductor layer 215 can be formed by using the group III-V compound semiconductor doped with a first conductive dopant. For instance, the first conductive semiconductor layer 215 can be formed by using a semiconductor material having the compositional formula of $In_xAl_yGa_{1-x-y}N$ (0≤x≤1, 0≤y≤1, 0≤x≤1, 0≤x+y≤1). If the first conductive semiconductor layer 215 is an N type semiconductor layer, the first conductive dopant includes the N type dopant, such as Si, Ge, Sn, Se or Te.

A semiconductor layer is formed between the buffer layer 213 and the first conductive semiconductor layer 215. The semiconductor layer may have the superlattice structure, in which heterogeneous first and second semiconductor layers are alternately stacked. Each of the first and second layers may have a thickness of about several A or above.

A first conductive clad layer (not shown) may be formed between the first conductive semiconductor layer 215 and the active layer 217. The first conductive clad layer may include a GaN-based semiconductor. The bandgap of the first conductive clad layer is wider than the bandgap of a barrier layer of the active layer 217. The first conductive clad layer may confine the carriers.

The active layer 217 is formed on the first conductive semiconductor layer 215. The active layer 217 may selectively include a single quantum well structure, a multiple quantum well (MQW) structure, a quantum dot structure, or a quantum wire structure. The active layer 217 may have a stack structure of well/barrier layers. The well/barrier layers may repeat with the periodicity of 2 to 20 by using the stack structures of InGaN/GaN, AlGaN/GaN, InGaN/AlGaN, or InGaN/InGaN.

A second conductive clad layer may be formed on the active layer 217. The bandgap of the second conductive clad layer is wider than the bandgap of the barrier layer of the active layer 217. The second conductive clad layer may include the group III-V compound semiconductor, such as a GaN-based semiconductor.

The second conductive semiconductor layer 219 is formed on the second conductive clad. The second conductive semiconductor layer 219 may include a second conductive dopant. For instance, the second conductive semiconductor layer 219 may include at least one of GaN, InN, AlN, InGaN, AlGaN, InAlGaN, and AlInN. If the second conductive semiconductor layer 219 is a P type semiconductor layer, the second conductive dopant is a P type dopant, such as Mg, Zn, Ca, Sr or Ba.

In a light emitting structure 220, the first and second conductive types may be changed inversely to the above. In detail, the second conductive semiconductor layer 219 may be formed of the N type semiconductor layer and the first conductive semiconductor layer 215 may be formed of the P type semiconductor layer. In addition, a third conductive semiconductor layer having polarity opposite to that of the second conductive semiconductor layer 219 can be formed on the second conductive semiconductor layer 219. In the light emitting device, the first conductive semiconductor layer 215, the active layer 217 and the second conductive semiconductor layer 219 may constitute the light emitting structure 220. The light emitting structure 220 may have one of an N-P junction structure, a P-N junction structure, an N-P-N junction structure, and a P-N-P junction structure. In the case of the N-P and P-N junction structures, the active layer is disposed between two layers. In the case of the N-P-N and P-N-P junction structures, at least one active layer is disposed among three layers.

The first electrode pad 241 is formed on the first conductive semiconductor layer 215 and the electrode layer 231 and the second electrode pad 251 are formed on the second conductive semiconductor layer 219.

The electrode layer 213 is a current spreading layer and includes transmittive and electric conductive materials. The electrode layer 213 has a refractive index lower than that of the compound semiconductor layer.

The electrode layer 213 is formed on the second conductive semiconductor layer 219. The electrode layer 213 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx and NiO. The electrode layer 213 may be formed of at least one layer. A reflective electrode layer may be formed in place of the electrode layer 231. The reflective electrode layer may include one selected from the group consisting of Al, Ag, Pd, Rh, Pt and Ir.

The first and second electrode pads 241 and 251 may include one selected from the group consisting of Ti, Ru, Rh, Ir, Mg, Zn, Al, In, Ta, Pd, Co, Ni, Si, Ge, Ag, Au, and an alloy thereof.

An insulating layer may be formed on the surface of the light emitting device. The insulating layer can prevent the interlayer short of the light emitting structure 220 as well as moisture penetration. In addition, a phosphor layer may be formed on the surface of the light emitting device to convert the wavelength of the light emitted from the active layer.

The second electrode pad 251 may be formed on the second conductive semiconductor layer 219 and/or the electrode layer 231 and may include a second electrode pattern 253.

The second electrode pattern 253 may have an arm structure or a finger structure branching from the second electrode pad 251. The second electrode pad 251 may include metal layers having the characteristics of the ohmic contact layer, the adhesive layer and the bonding layer, and may be formed by using transmittive material, but the embodiment is not limited thereto.

When viewed from the top of the light emitting chip, the second electrode pad 251 is spaced apart from the first electrode pad 241 by a predetermined distance corresponding to a half or more of a width of one lateral side of the light emitting chip. In addition, the second electrode pattern 253 may be formed on the electrode layer 231 with a length corresponding to a half or more of a width of one lateral side of the light emitting chip.

A part of at least one of the second electrode pad 251 and the second electrode pattern 253 can make ohmic-contact with the top surface of the second conductive semiconductor layer 219, but the embodiment is not limited thereto.

The first electrode pad 241 is formed in the first region A3 on the top surface of the first conductive semiconductor layer 215. The first region A3 is a local region of the first conductive semiconductor layer 215 where the second conductive semiconductor layer 219 and the active layer 217 are partially etched and the top surface of the first conductive semiconductor layer 215 is partially exposed. The top surface of the first conductive semiconductor layer 215 is stepped with respect to the lateral side of the active layer 217 and located below the lower surface of the active layer 217.

A slot 235 is formed in the light emitting structure 220. The slot 235 has a depth ranging from the top surface of the light emitting structure 220 to the top surface of the first conductive semiconductor layer 215. The depth of the first region A3 of the first conductive semiconductor layer 215 is equal to or different from the depth of the slot 235 when measured from the top surface of the light emitting structure 220. The slot 225 may be omitted.

A first electrode pattern may be connected to the first electrode pad 241. In detail, at least one first electrode pattern is connected to the first electrode pad 241. When viewed from the top of the light emitting chip, the first electrode pattern may be disposed at one side of the second electrode pattern 253 or within the second electrode pattern 253. The first electrode pattern may be disposed in the slot 235 of the light emitting structure while making contact with the top surface of the first conductive semiconductor layer 215. The first electrode pattern extends closely to the second electrode pad 251 from the first electrode pattern 241 and the second electrode pattern extends closely to the first electrode pad 241 from the second electrode pattern 251.

<Lighting System>

The light emitting device package according to the embodiments may be applied to a lighting system. The light system may have an array structure including a plurality of light emitting device packages. The lighting system may include a display apparatus shown in FIGS. 18 and 19, a light unit shown in FIG. 20, in addition to a lighting lamp, a signal light, a vehicle headlight, an electronic display, etc.

Figure 18:
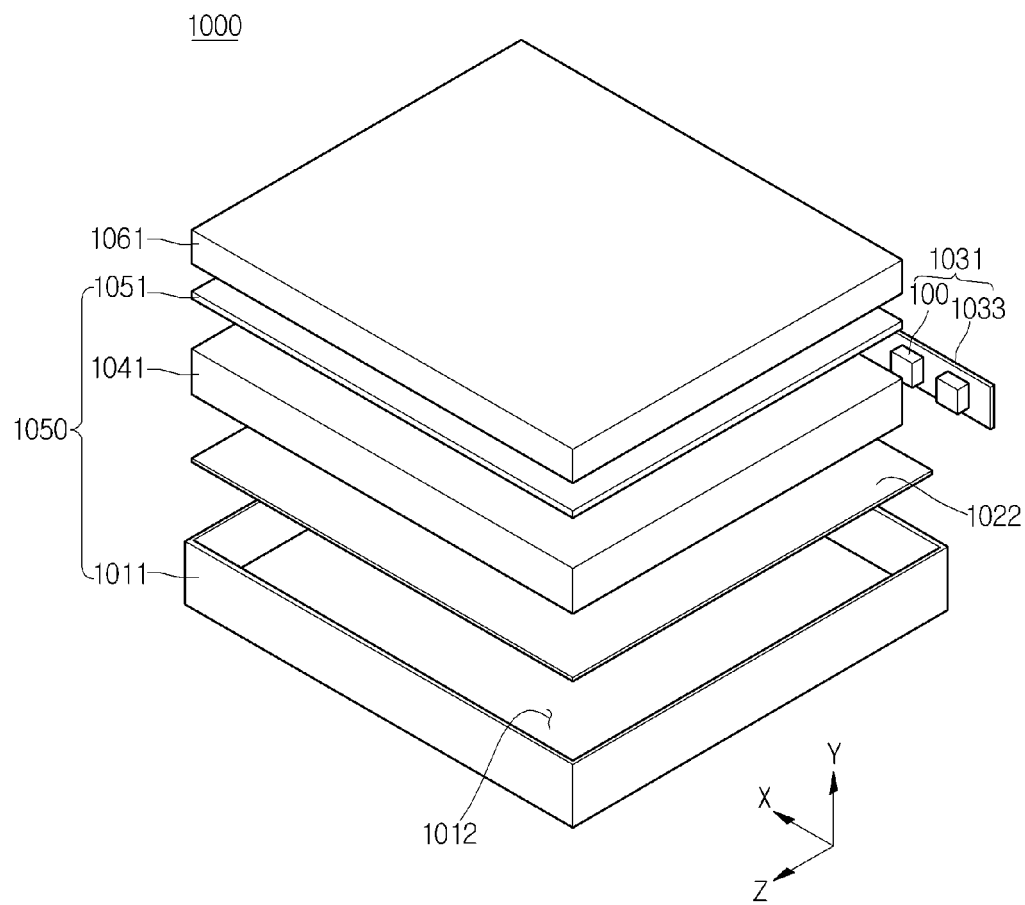
FIG. 18 is a disassembled perspective view of a display apparatus provided with the light emitting device.

FIG. 18 is a disassembled perspective view of a display apparatus according to an embodiment.

Referring to FIG. 18, the display apparatus 1000 according to the embodiment may include a light guide plate 1041, a light emitting module 1031 supplying light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1041, the light emitting module 1031, and the reflective member 1022, but the present disclosure is not limited thereto.

The bottom cover 1011, the reflective member 1022, the light guide plate 1041, and the optical sheet 1051 may be defined as a light unit 1050.

The light guide plate 1041 functions to transform linear light to planar light by diffusing the linear light. The light guide plate 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide plate 1041, and finally acts as a light source of a display apparatus.

The light emitting module 1031 may include at least one light emitting module in the bottom cover 1011, and provide light directly or indirectly from one side surface of the light guide plate 1041. The light emitting module 1031 may include a board 1033, and a light emitting device package 100 according to embodiments disclosed above, and the light emitting device packages 100 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 100 is mounted on a side surface or a radiant heat plate, the board 1033 may be removed. Herein, some of the radiant heat plate may contact an upper surface of the bottom cover 1011.

The plurality of light emitting device packages 100 may be mounted on the board 1033 such that light emitting surfaces of the plurality of light emitting device packages 100 are spaced apart by a predetermined distance from the light guide plate 1041, but the present disclosure is not limited thereto. The light emitting device package 100 may supply light to a light incident part that is one side surface of the light guide plate 1041, directly or indirectly, but the present disclosure is not limited thereto.

The reflective member 1022 may be provided under the light guide plate 1041. The reflective member 1022 reflects light incident from a lower surface of the light guide plate 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide plate 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or non-metallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide plate 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide plate 1041, and the optical sheet 1051 as optical members positioned on a light path of the light emitting module 1031, but the present disclosure is not limited thereto.

Figure 19:
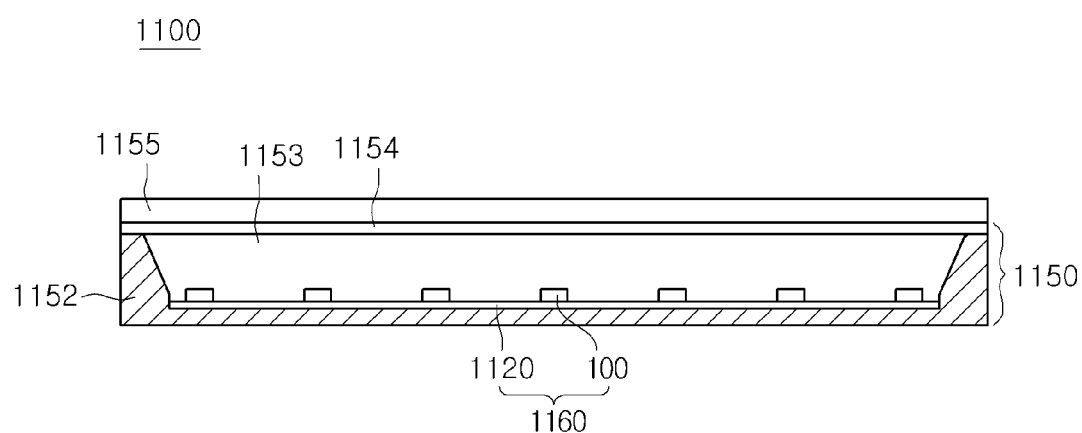
FIG. 19 is a schematic sectional view illustrating another example of a display apparatus provided with the light emitting device.

FIG. 19 is a cross-sectional view of a display apparatus according to an embodiment.

Referring to FIG. 19, the display apparatus 1100 includes a bottom cover 1152, a board 1120 on which the light emitting device packages 100 disclosed above are arrayed, an optical member 1154, and a display panel 1155.

The board 1120 and the light emitting device package 100 may be defined as a light emitting module 1160. The bottom cover 1152, the at least one light emitting module 1160, and the optical member 154 may be defined as a light unit.

The bottom cover 1152 may be provided with a receiving part, but the present disclosure is not limited thereto.

Herein, the optical member 1154 may include at least one of a lens, a light guide plate, a diffusion sheet, a horizontal and vertical prism sheet, and a brightness reinforcing sheet. The light guide plate may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1160. The optical member 154 transforms light emitted from the light emitting module 1160 to planar light, and performs diffusion, light focusing, and the like.

Figure 20:
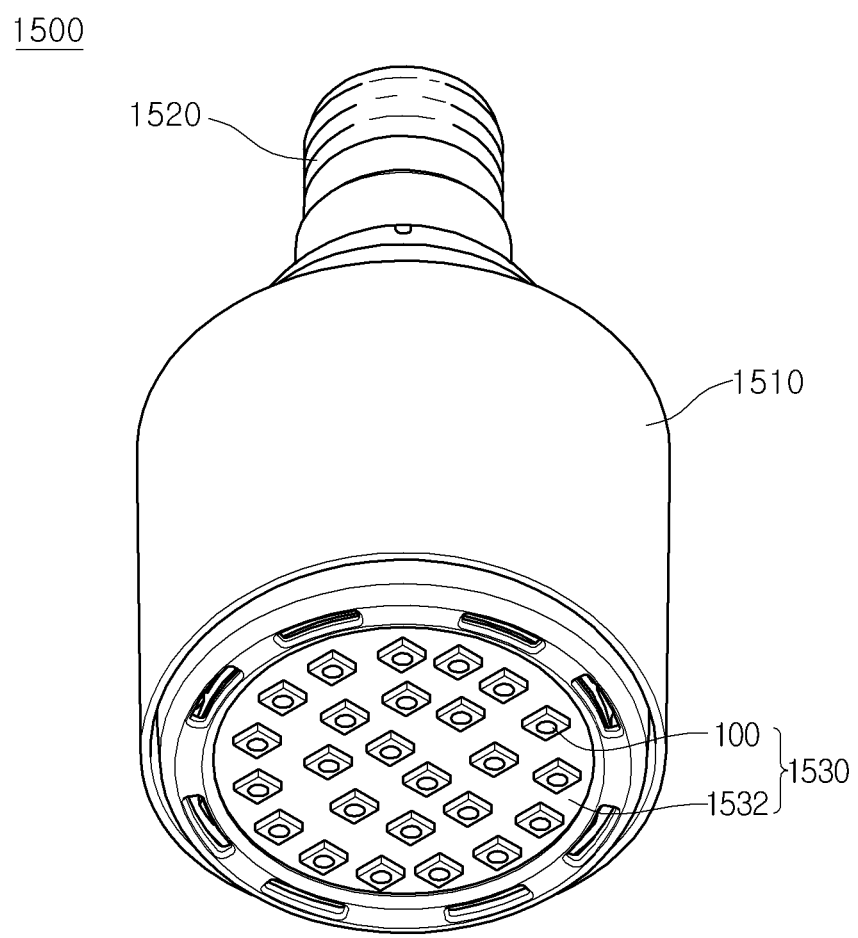
FIG. 20 is a perspective view of a lighting unit provided with the light emitting device.

FIG. 20 is a perspective view of a lighting unit according to an embodiment.

Referring to FIG. 20, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 100 according to the embodiments mounted on the board 1532. The light emitting device package 100 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 100 may be mounted on the board 1532. Each of the light emitting device packages 100 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, electric variability of individual light emitting devices, such as forward voltage in the light emitting device package, can effectively be detected.

According to the embodiment, the data measurement time of the light emitting device package can be shortened, so that the reliability of the light emitting device package can be improved.

The embodiment can provide the light emitting device package capable of protecting the light emitting devices.

The embodiment can improve the reliability of the light emitting device package and the light unit including the same.

The embodiment provides a light emitting device package including protective devices to individually protect a plurality of light emitting devices.

The embodiment provides a light emitting device package, in which a plurality of light emitting devices are disposed in a plurality of cavities in parallel to each other, so that variability of individual light emitting devices can be effectively detected.

A light emitting device package according to the embodiment includes a body; a first lead frame having a first cavity in a first region of the body; a second lead frame having a second cavity in a second region of the body; a first bonding part adjacent to a first lateral side of the body and extended from the first cavity of the first lead frame; a second bonding part adjacent to a second lateral side of the body, which is opposite to the first lateral side of the body, and extended from the second cavity of the second lead frame; a first light emitting device in the first cavity; a second light emitting device in the second cavity; a third cavity adjacent to the first bonding part; and a first protective device in the third cavity, wherein the first light emitting device is connected to the first protective device.

A light emitting device package according to the embodiment includes a body formed of an insulating material and having a recess; a first lead frame having a first cavity in the recess of the body; a second lead frame having a second cavity in the recess of the body; a first bonding connected to the first cavity on a bottom of the recess; a second bonding part connected to the second cavity on a bottom of the recess; a first light emitting device in the first cavity; a second light emitting device in the second cavity; a third cavity spaced apart from the first and second cavities and disposed in the recess; a first protective device disposed in the third cavity and connected to at least one of first and second light emitting devices; and a molding member disposed in the recess.

A light unit according to the embodiment includes the light emitting device package; a module substrate where the light emitting device packages are arrayed; and an optical member on at least one side of the light emitting device package.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body;
   a plurality of lead frames including a first lead frame and a second lead frame embedded in the body;
   a first light emitting device disposed on the first lead frame;
   a second light emitting device disposed on the second lead frame;
   a first wire having a first end connected to the first lead frame and a second end connected to the first light emitting device; and
   a second wire having a first end connected to the second lead frame and a second end connected to the second light emitting device,
   wherein the body includes:
      a bottom portion;
      a first sidewall and a second sidewall disposed on the bottom portion and extending in a first direction;
      a third sidewall and a fourth sidewall disposed on the bottom portion and extending from the first sidewall toward the second sidewall, and
      wherein the bottom portion is disposed on a bottom of the body between the first sidewall, the second sidewall, the third sidewall and the fourth sidewall,
      wherein a length between an outer side of the first sidewall and an outer side of the second sidewall in a second direction orthogonal to the first direction is longer than a length between an outer side of the third sidewall and an outer side of the fourth sidewall in the first direction,
   wherein the first lead frame includes:
      a first upper surface on which the first light emitting device is disposed and exposed on the bottom portion; and
      a second upper surface extending from the first upper surface toward the first sidewall, exposed on the bottom portion and on which the first end of the first wire is disposed,
   wherein the second lead frame includes:
      a third upper surface on which the second light emitting device is disposed and exposed on the bottom portion; and
      a fourth upper surface extending from the third upper surface toward the second sidewall, exposed on the bottom portion and on which the first end of the second wire is disposed,
   wherein the first light emitting device is disposed closer to a center line passing from a center of the outer side of the third sidewall to a center of the outer side of the fourth sidewall than the outer side of the first sidewall,
   wherein the second light emitting device is disposed closer to the center line than the outer side of the second sidewall, wherein the center line extends from the center of the outer side of the third sidewall toward the center of the outer side of the fourth sidewall in the first direction, wherein a length of the first upper surface in the first direction is longer than a length of the second upper surface in the first direction, wherein a length of the third upper surface in the first direction is longer than a length of the fourth upper surface in the first direction, wherein a length of the first upper surface in the second direction is longer than a length of the second upper surface in the second direction, wherein a length of the third upper surface in the second direction is longer than a length of the fourth upper surface in the second direction, and wherein a region of the body in the first direction corresponding to the center line is exposed to the bottom portion of the body and on which the plurality of lead frames are not exposed.

2. The light emitting device package of claim 1, wherein a shortest distance between the first light emitting device and the second light emitting device is shorter than a shortest distance between the first light emitting device and the outer side of the first sidewall, and is shorter than a shortest distance between the second light emitting device and the outer side of the second sidewall.

3. The light emitting device package of claim 2, wherein the shortest distance between the first light emitting device and the outer side of the first sidewall is substantially the same as the shortest distance between the second light emitting device and the outer side of the second sidewall.

4. The light emitting device package of claim 2, wherein a shape of the first upper surface is substantially the same as a shape of the third upper surface, and wherein a shape of the second upper surface is substantially the same as a shape of the fourth upper surface.

5. The light emitting device package of claim 2, wherein the first light emitting device and the second light emitting device overlap in the second direction, wherein the first upper surface of the first lead frame and the third upper surface of the second lead frame overlap in the second direction, and wherein the second upper surface of the first lead frame and the fourth upper surface of the second lead frame overlap in the second direction.

6. The light emitting device package of claim 2, wherein a shape of the first upper surface and a shape of the third upper surface are substantially symmetrical with respect to the center line, and wherein a shape of the second upper surface and a shape of the fourth upper surface are substantially symmetrical with respect to the center line.

7. The light emitting device package of claim 2, wherein the length of the first upper surface in the first direction extends substantially equally from the center line toward the first sidewall, wherein the length of the third upper surface in the first direction extends substantially equally from the center line toward the second sidewall, and wherein an area of the first upper surface is substantially equal to an area of the third upper surface.

8. The light emitting device package of claim 7, wherein a shape of the first upper surface and a shape of the third upper surface are substantially symmetrical with respect to the center line.

9. The light emitting device package of claim 4, wherein an area of the first upper surface is greater than an area of the second upper surface, wherein an area of the third upper surface is greater than an area of the fourth upper surface, wherein the area of the first upper surface is substantially equal to the area of the third upper surface, and wherein the area of the second upper surface is substantially equal to the area of the fourth upper surface.

10. The light emitting device package of claim 1, wherein the second upper surface and the fourth upper surface have different lengths in the first direction.

11. The light emitting device package of claim 10, wherein a region of the second upper surface being farthest from the first upper surface has a minimum length in the first direction, and wherein a region of the fourth upper surface farthest from the third upper surface has a minimum length in the first direction.

12. A light emitting device package comprising:
a body;
a plurality of lead frames including a first lead frame and a second lead frame embedded in the body;
a first light emitting device disposed on the first lead frame;
a second light emitting device disposed on the second lead frame;
a first wire having a first end connected to the first lead frame and a second end connected to the first light emitting device; and
a second wire having a first end connected to the second lead frame and a second end connected to the second light emitting device,
wherein the body includes:
 a bottom portion;
 a first sidewall and a second sidewall disposed on the bottom portion and extending in a first direction;
 a third sidewall and a fourth sidewall disposed on the bottom portion and extending from the first sidewall toward the second sidewall, and
 wherein the bottom portion is disposed on a bottom of the body between the first sidewall, the second sidewall, the third sidewall and the fourth sidewall,
 wherein a length between an outer side of the first sidewall and an outer side of the second sidewall in a second direction orthogonal to the first direction is longer than a length between an outer side of the third sidewall and an outer side of the fourth sidewall in the first direction,
wherein the first lead frame includes:
 a first upper surface on which the first light emitting device is disposed and exposed on the bottom portion; and
 a second upper surface extending from the first upper surface toward the first sidewall, exposed on the bottom portion and on which the first end of the first wire is disposed,
wherein the second lead frame includes:
 a third upper surface on which the second light emitting device is disposed and exposed on the bottom portion; and a fourth upper surface extending from the third upper surface toward the second sidewall, exposed on the bottom portion and on which the first end of the second wire is disposed, wherein the first light emitting device is disposed closer to a center line passing from a center of the outer side of the third sidewall to a center of the outer side of the fourth sidewall than the outer side of the first sidewall, wherein the second light emitting device is disposed closer to the center line than the outer side of the second sidewall, wherein the center line extends from the center of the outer side of the third sidewall toward the center of the outer side of the fourth sidewall in the first direction, wherein a length of the first upper surface in the first direction is longer than a length of the second upper surface in the first direction, wherein a length of the third upper surface in the first direction is longer than a length of the fourth upper surface in the first direction, wherein a length of the first upper surface in the second direction is longer than a length of the second upper surface in the second direction, wherein a length of the third upper surface in the second direction is longer than a length of the fourth upper surface in the second direction, wherein the first lead frame has a maximum length in the second direction greater than a maximum length of the first lead frame in the first direction, and wherein the second lead frame has a maximum length in the second direction greater than a maximum length of the first lead frame in the first direction.

13. The light emitting device package of claim 12,
wherein an area of the first upper surface is greater than an area of the second upper surface,
wherein an area of the third upper surface is greater than an area of the fourth upper surface,
wherein the first light emitting device and the second light emitting device overlap in the second direction,
wherein the first upper surface of the first lead frame and the third upper surface of the second lead frame overlap in the second direction, and
wherein the second upper surface of the first lead frame and the fourth upper surface of the second lead frame overlap in the second direction.

14. The light emitting device package of claim 13,
wherein the first upper surface and the second upper surface of the first lead frame overlap the third upper surface and the fourth upper surface of the second lead frame in the second direction.

15. The light emitting device package of claim 14,
wherein an area of the first upper surface is greater than an area of the second upper surface, and
wherein a shape of the second upper surface and a shape of the fourth upper surface are substantially symmetrical with respect to the center line.

16. The light emitting device package of claim 12,
wherein the first end of the first wire is disposed closer to the outer side of the first sidewall than the center line,
wherein the first end of the second wire is disposed closer to the outer side of the second sidewall than the center line,
wherein a shortest distance between the first end of the first wire and the first end of the second wire is larger than a shortest distance between the second end of the first wire and the second end of the second wire,
wherein a distance between the first end of the first wire and the second end of the second wire is smaller than a shortest distance between the first end of the first wire and the second end of the second wire.

17. The light emitting device package of claim 12,
wherein a shortest distance between the first end of the first wire and the outer side of the first sidewall is shorter than a shortest distance between the first end of the first wire and the center line, and
wherein a shortest distance between the second end of the second wire and the outer side of the second sidewall is shorter than a shortest distance between the first end of the second wire and the center line.

18. The light emitting device package of claim 17,
wherein the first light emitting device is connected to two wires, the two wires connected to the first light emitting device include the first wire, and
wherein the second light emitting device is connected to two wires, and the two wires connected to the second light emitting device include the second wire.

19. A light emitting device package comprising:
a body;
a plurality of lead frames including a first lead frame and a second lead frame embedded in the body;
a first light emitting device disposed on the first lead frame;
a second light emitting device disposed on the second lead frame;
a first wire having a first end connected to the first lead frame and a second end connected to the first light emitting device; and
a second wire having a first end connected to the second lead frame and a second end connected to the second light emitting device,
wherein the body includes:
  a bottom portion;
  a first sidewall and a second sidewall disposed on the bottom portion and extending in a first direction;
  a third sidewall and a fourth sidewall disposed on the bottom portion and extending from the first sidewall toward the second sidewall, and
  wherein the bottom portion is disposed on a bottom of the body between the first sidewall, the second sidewall, the third sidewall and the fourth sidewall,
  wherein a length between an outer side of the first sidewall and an outer side of the second sidewall in a second direction orthogonal to the first direction is longer than a length between an outer side of the third sidewall and an outer side of the fourth sidewall in the first direction,
wherein the first lead frame includes:
  a first upper surface on which the first light emitting device is disposed and exposed on the bottom portion; and
  a second upper surface extending from the first upper surface toward the first sidewall, exposed on the bottom portion and on which the first end of the first wire is disposed,
wherein the second lead frame includes:
  a third upper surface on which the second light emitting device is disposed and exposed on the bottom portion; and a fourth upper surface extending from the third upper surface toward the second sidewall, exposed on the bottom portion and on which the first end of the second wire is disposed, wherein the first light emitting device is disposed closer to a center line passing from a center of the outer side of the third sidewall to a center of the outer side of the fourth sidewall than the outer side of the first sidewall, wherein the second light emitting device is disposed closer to the center line than the outer side of the second sidewall, wherein the center line extends from the center of the outer side of the third sidewall toward the center of the outer side of the fourth sidewall in the first direction, wherein a length of the first upper surface in the first direction is longer than a length of the second upper surface in the first direction, wherein a length of the third upper surface in the first direction is longer than a length of the fourth upper surface in the first direction, wherein a length of the first upper surface in the second direction is longer than a length of the second upper surface in the second direction, wherein a length of the third upper surface in the second direction is longer than a length of the fourth upper surface in the second direction, wherein a region of the body in the first direction corresponding to the center line is exposed to the bottom portion of the body and on which the plurality of lead frames are not exposed, wherein a maximum length of the center line in the second direction is smaller than a maximum length of the first lead frame in the second direction, wherein the first lead frame has the maximum length in the second direction greater than a maximum length of the first lead frame in the first direction, wherein the first light emitting device is connected to two wires, the two wires connected to the first light emitting device include the first wire, and wherein the second light emitting device is connected to two wires, and the two wires connected to the second light emitting device include the second wire.

20. The light emitting device package of claim 19, wherein a shortest distance between the first end of the first wire and the outer side of the first sidewall is shorter than a shortest distance between the first end of the first wire and the center line, wherein a shortest distance between the first end of the second wire and the outer side of the second sidewall is shorter than a shortest distance between the one end of the second wire and the center line, wherein the second end of the first wire is disposed closer to the center line than the outer side of the first sidewall, and wherein the second end of the second wire is disposed closer to the center line than the outer side of the second sidewall.

* * * * *